United States Patent
Chen et al.

(10) Patent No.: US 9,053,974 B2
(45) Date of Patent: Jun. 9, 2015

(54) SRAM CELLS WITH DUMMY INSERTIONS

(75) Inventors: Chao-Hsuing Chen, Tainan (TW); Ling-Sung Wang, Tainan (TW); Chi-Yen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 265 days.

(21) Appl. No.: 13/594,620

(22) Filed: Aug. 24, 2012

(65) Prior Publication Data

US 2014/0054716 A1  Feb. 27, 2014

(51) Int. Cl.
*H01L 21/70* (2006.01)
*H01L 27/11* (2006.01)
*H01L 27/02* (2006.01)

(52) U.S. Cl.
CPC ........ *H01L 27/1104* (2013.01); *H01L 27/0207* (2013.01)

(58) Field of Classification Search
CPC ................. H01L 27/1104; H01L 27/0207
USPC .................. 257/369, 401, E27.06, E27.062
See application file for complete search history.

(56) References Cited

U.S. PATENT DOCUMENTS

2006/0128050 A1\* 6/2006 Lee ................................. 438/60
2013/0193516 A1\* 8/2013 Goldbach et al. ............. 257/368

\* cited by examiner

*Primary Examiner* — Tan N Tran
(74) *Attorney, Agent, or Firm* — Slater & Matsil, L.L.P.

(57) ABSTRACT

A device includes a first pull-up transistor, a second pull-up transistor, and a dummy gate electrode between the first and the second pull-up transistors. The first and the second pull-up transistors are included in a first Static Random Access Memory (SRAM) cell.

20 Claims, 3 Drawing Sheets

SRAM CELLS WITH DUMMY INSERTIONS

BACKGROUND

Static Random Access Memory (SRAM) is commonly used in integrated circuits. SRAM cells have the advantageous feature of holding data without a need for refreshing. Typically, in the formation of the SRAM, a plurality of SRAM cells is arranged as an array having a plurality of rows and a plurality of columns. An SRAM array typically has millions of SRAM cells. Due to the large number of SRAM cells in the SRAM cell array, reducing the layout size of the SRAM cells is critical for increasing the number of SRAM cells in a large SRAM array. To reduce the size of SRAM cells, the sizes of P-type Metal-Oxide-Semiconductor (PMOS) transistors and N-type Metal-Oxide-Semiconductor (NMOS) transistors in the SRAM cells are reduced. Furthermore, the distance between neighboring PMOS devices and NMOS devices are also reduced.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements. Although six-transistor (6T) SRAM cells are used as examples to explain the concept of the embodiments, the embodiments is readily applicable to other SRAM cells having different number of transistors, such as 8T SRAM cells.

Figure 1:
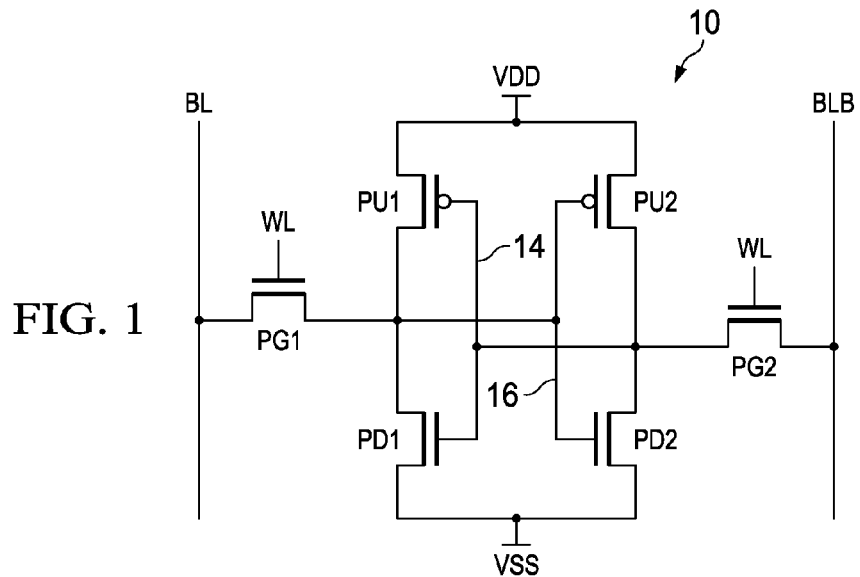
FIG. 1 is a circuit diagram of a Static Random Access Memory (SRAM) cell in accordance with exemplary embodiments.

FIG. 1 illustrates a circuit diagram of SRAM cell 10 in accordance with some embodiments. The SRAM cell includes pass-gate transistors PG1 and PG2, pull-up transistors PU1 and PU2, which are P-type Metal-Oxide-Semiconductor (PMOS) transistors, and pull-down transistors PD1 and PD2, which are N-type Metal-Oxide-Semiconductor (NMOS) transistors. The gates of pass-gate transistors PG1 and PG2 are controlled by word-line WL that determines whether a SRAM cell 10 is selected or not. A latch formed of pull-up transistors PU1 and PU2 and pull-down transistors PD1 and PD2 stores a bit. The stored bit can be written into, or read from, SRAM cell 10 through bit lines BL and BLB. SRAM cell 10 is powered through a positive power supply node VDD that has a positive power supply voltage (also denoted as VDD). SRAM cell is also connected to power supply node VSS, which may be an electrical ground.

Figure 2:
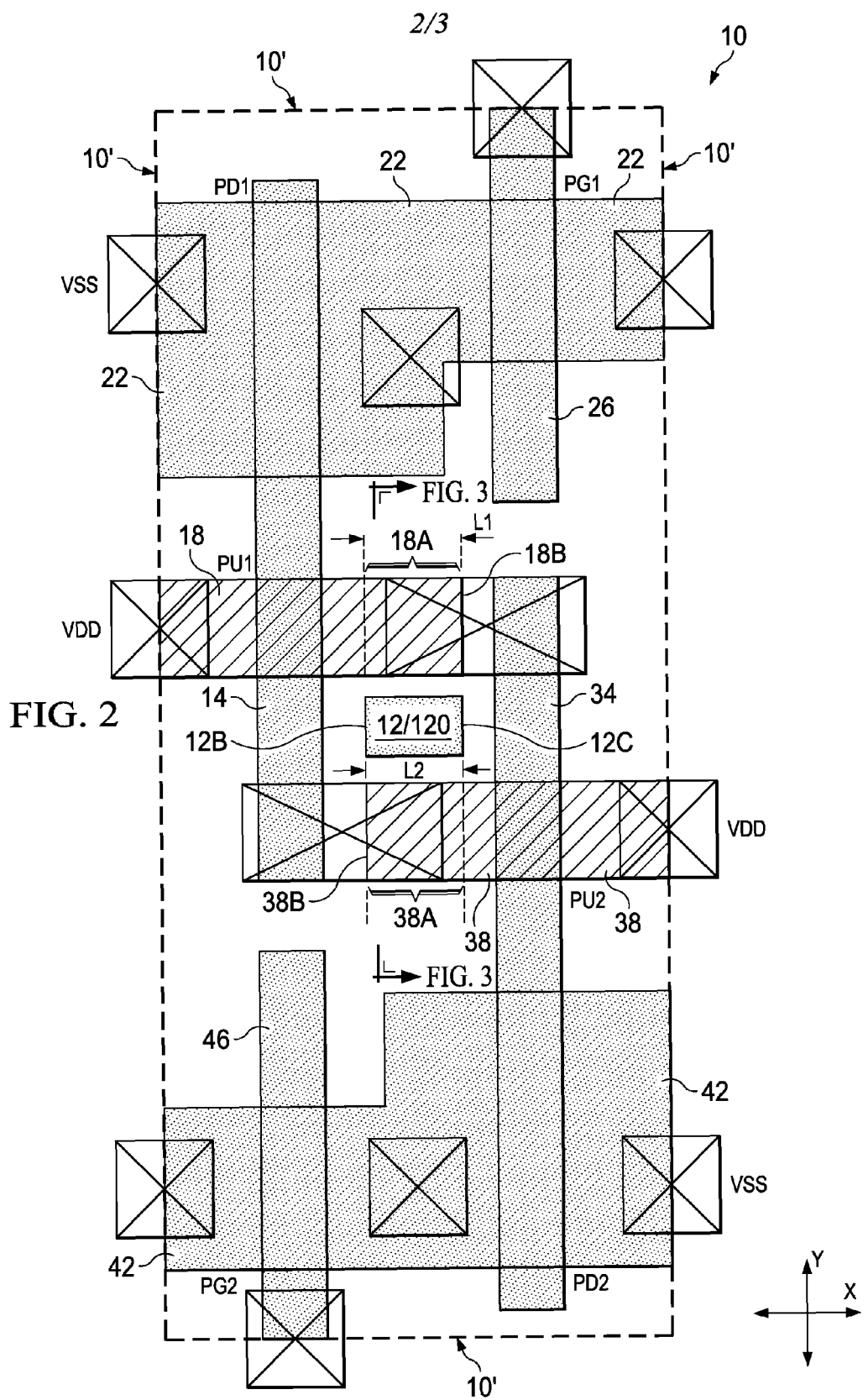
FIG. 2 is a layout of the SRAM cell in accordance with exemplary embodiments.

FIG. 2 illustrates a layout (a top view) of SRAM cell 10 in accordance with exemplary embodiments. The outer boundaries of SRAM cell 10 are illustrated using dashed lines, which are marked as 10'. Nodes VDD and VSS are also illustrated. Gate electrode 14 forms pull-up transistor PU1 with the underlying active region (an n-well region) 18. Gate electrode 14 further forms pull-down transistor PD1 with the underlying active region (a p-well region) 22. Gate electrode 26 forms pass-gate transistor PG1 with the underlying active region 22. Gate electrode 34 forms pull-up transistor PU2 with the underlying active region (an n-well region) 38. Gate electrode 34 further forms pull-down transistor PD2 with the underlying active region (a p-well region) 42. Gate electrode 46 forms pass-gate transistor PG2 with the underlying active region 42.

In the illustrated exemplary embodiments, n-type active regions 18 and 38 have lengthwise directions parallel to the X direction, and gate electrodes 14 and 34 have lengthwise directions parallel to the Y direction, which is perpendicular to the X direction. Active region 18 includes portion 18A aligned to portions 38A of active region 38, wherein the alignment direction is in the Y direction. Dummy feature 12 is formed between active regions 18 and 38, and between gate electrodes 14 and 34. Portions 18A and 38A are connected to (and may be portions of) the drain regions of pull-up transistor PU1 and pull-up transistor PU2, respectively. Accordingly, dummy feature 12 is also located between the drain regions of pull-up transistors PU1 and PU2. Dummy feature 12 comprises dummy gate electrode 120 (FIG. 3), which may be formed of the same material as, and at a same level as, gate electrodes 14, 34, 26, and/or 46. Dummy feature 12 may also be formed simultaneously as gate electrodes 14, 34, 26, and/or 46. In some exemplary embodiments, dummy gate electrode 120 comprises polysilicon. In alternative embodiments, dummy gate electrode 120 comprises other conductive materials such as a metal, a metal alloy, a metal silicide, or the like.

In the illustrated top view as in FIG. 2, dummy feature 12 is formed between active regions 18 and 38, and is aligned to portions 18A of active region 18 and portion 38A of active region 38. In some embodiments, left edge 12B of dummy feature 12 is aligned to (in the Y direction) the left edge 38B of active region 38. Alternatively, left edge 12B of dummy feature 12 may further extend to the left of left edge 38B. Right edge 12C of dummy feature 12 may be aligned to the right edge 18B of active region 18, or extends further to the right of right edge 18B. Furthermore, when portions 18A and 38A have length L1, length L2 of dummy feature 12, which is measured in the X direction, may be equal to or greater than length L1, although length L2 may also be smaller than length L1 in alternative embodiments.

In some embodiments, no additional dummy features that are formed of the same material as dummy feature 12 is disposed in SRAM cell 10 and between other neighboring active regions. For example, no additional dummy features are formed between active regions 18 and 22, and no additional dummy features are formed between active regions 38 and 42. In alternative embodiments, dummy features may also be formed between other active regions such as between active regions 18 and 22, and/or between active regions 38 and 42.

Figure 3:
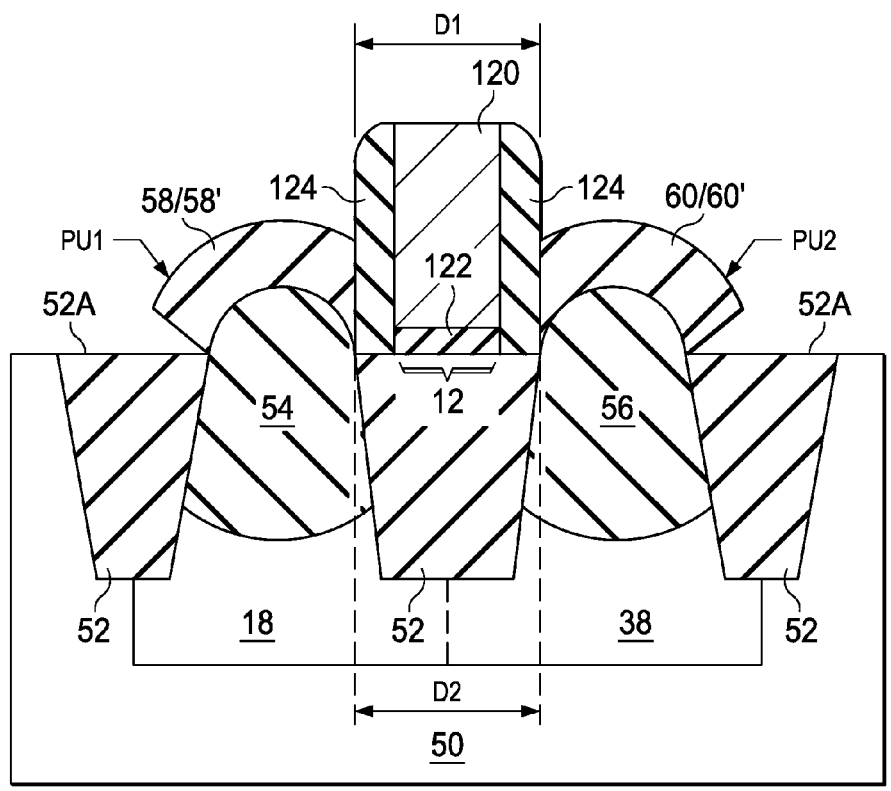
FIG. 3 illustrates a cross-sectional of a portion of the SRAM cell, wherein a dummy feature between drain regions of pull-up transistors of the SRAM cell is illustrated.

FIG. 3 illustrates a cross-sectional view of a part of SRAM cell 10, wherein the cross-sectional view is obtained from the plane crossing line 3-3 in FIG. 2. As shown in FIG. 3, SRAM cell 10 includes active regions 18 and 38, which are n-type doped well regions that are in semiconductor substrate 50. Semiconductor substrate 50 may be a silicon substrate, although it may also be formed of other semiconductor materials. Isolation regions such as Shallow Trench Isolation (STI) regions 52 are formed on adjacent to the top surface of substrate 50. Active regions 18 and 38 comprise portions that are located between STI regions 52.

In some embodiments, pull-up transistors PU1 and PU2 include epitaxy regions 54 and 56. Epitaxy regions 54 and 56 may be formed of silicon germanium (SiGe), for example. The formation of epitaxy regions 54 and 56 may include epitaxial growth. Before the epitaxial growth, active regions 18 and 38 may be etched first, so that the interface between active region 18 and epitaxy region 54 is below top surface 52A of STI regions 52, and the interface between active region 38 and epitaxy region 56 is below top surface 52A of STI regions 52. Over epitaxy regions 54 and 56 are semiconductor caps 58 and 60, respectively, which at least have a germanium concentration lower than the germanium concentration in epitaxy regions 54 and 56. Semiconductor caps 58 and 60 may also be silicon caps that are free from germanium. In some embodiments, semiconductor caps 58 and 60 are selectively grown on epitaxy regions 54 and 56, respectively. In subsequent process steps, semiconductor caps 58 and 60 may be silicided to form silicide regions, which are illustrated and marked as 58' and 60', respectively. The illustrated regions 54 and 56 form the drain regions of pull-up transistors PU1 and PU2, respectively, and the overlying silicide regions 58' and 60' form the drain silicide regions.

Semiconductor caps 58 and 60 may be formed using epitaxy. In their formation process, there may be a lateral growth and a vertical growth occurring simultaneously. As a result, if there is no dummy feature 12, distance D1 between caps 58 and 60 (and the distance between silicides 58' and 60') will be reduced due to the lateral growth. Distance D1 may also be smaller than distance D2 between active regions 18 and 38. The small distance between silicide regions 58' and 60' may cause leakage currents between the drain regions of pull-up transistors PU1 and PU2. Dummy feature 12 is hence formed to prevent silicide regions 58' and 60' from being too close to each other in order to reduce or eliminate the leakage currents.

As shown in the cross-sectional view, dummy feature 12 overlaps STI region 52. Dummy feature 12 comprises dummy gate electrode 120, which may be electrically floating. Dummy feature 12 may also include dummy gate dielectric 122 underlying dummy gate electrode 120. Dummy gate dielectric 122 may be formed simultaneously as the formation of other gate dielectrics (not shown) that are underlying gate electrodes 14, 34, 26, and 46 (FIG. 2). Dummy gate spacers 124 are formed on the sidewalls of dummy gate electrode 120. When semiconductor caps 58 and 60 are grow to contact dummy gate spacers 124, semiconductor caps 58 and 60 no longer grow toward each other. Similarly, silicide regions 58' and 60' may also contact dummy gate spacers 124. The distance between regions 58 and 60 (and regions 58' and 60') is thus defined by the width of dummy gate electrode 120 and the thickness of dummy gate spacers 124.

Figure 4:
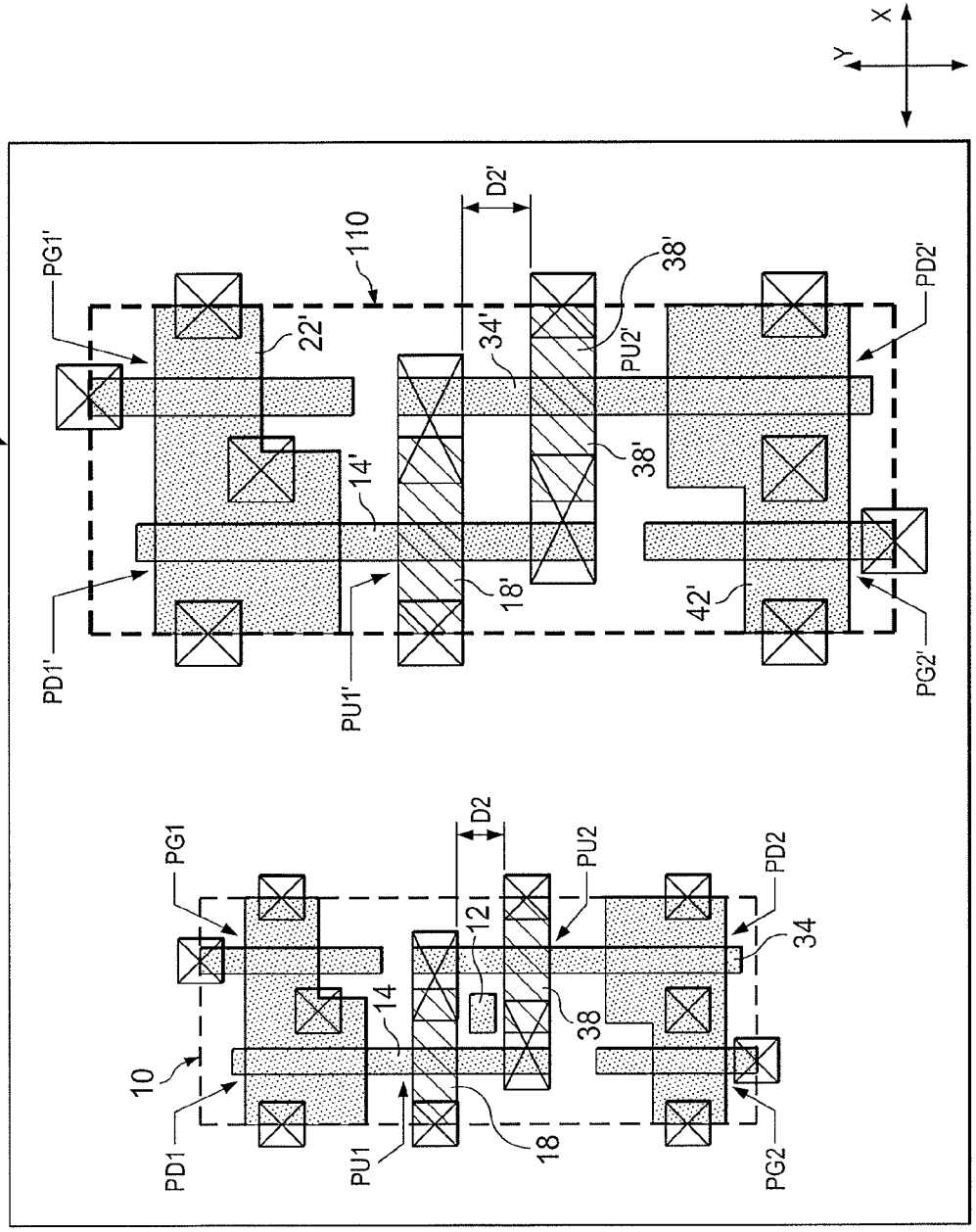
FIG. 4 illustrates a chip including two SRAM cells having different sizes, wherein a dummy feature is formed in a small SRAM cell, and no dummy feature is formed in a large SRAM cell.

FIG. 4 illustrates SRAM cell 10 and SRAM cell 110, which are formed in the same chip 200. SRAM cell 10 and 110 are referred to as a small SRAM cell and a large SRAM cell, respectively. SRAM cell 10 and 110 may belong to different SRAM arrays. Small SRAM cell 10 may be the same as SRAM cell 10 shown in FIGS. 1 through 3. Small SRAM cell 10 has a layout size smaller than the layout size of large SRAM cell 110. The layout sizes of SRAM cells 10 and 110 are also the chip areas occupied by SRAM cells 10 and 110, respectively. In the illustrated embodiments, the cell components of large SRAM cell 110 are denoted using similar reference notations as SRAM cell 10, except that the reference notations of SRAM cell 110 has an extra "'" sign. The distance between active regions 18 and 38 is D2, and the distance between active regions 18' and 38' is D2', which is greater than distance D2. In some exemplary embodiments, distance D2 is smaller than about 75 nm. Dummy feature 12 is thus added to eliminate the likely leakage currents between the drain region of pull-up transistor PU1 and the drain region of pull-up transistor PU2. On the other hand, SRAM cell 110 is a large cell, and hence distance D2' is great enough. Hence, the leakage current between the drain regions of pull-up transistors PU1 and PU2, if any, is negligible. Accordingly, no dummy feature is inserted between active regions 18' and 38'.

In the embodiments, by inserting a dummy feature including a dummy gate electrode between the drains of the neighboring pull-up transistors of SRAM cells, the distance between the drains of the pull-up transistors of the SRAM cells will be greater than a certain threshold value. The leakage currents between the drains of the pull-up transistors of the SRAM cells are thus limited.

In accordance with embodiments, a device includes a first pull-up transistor, a second pull-up transistor, and a dummy gate electrode between the first and the second pull-up transistors. The first and the second pull-up transistors are included in a SRAM cell.

In accordance with other embodiments, a device includes a first PMOS transistor and a second PMOS transistor. The first PMOS transistor includes a first active region, a first gate electrode over the first active region, and a first drain region on a side of the first gate electrode. The second PMOS transistor includes a second active region, a second gate electrode over the second active region, and a second drain region on a side of the second gate electrode. A dummy gate electrode is disposed between the first and the gate electrodes, and between the first and the second drain regions. The first PMOS transistor, the second PMOS transistor, and the dummy gate electrode are in an SRAM cell.

In accordance with yet other embodiments, a device includes a first SRAM cell and a second SRAM cell in a same chip. The first SRAM cell includes a first pull-up transistor, a second pull-up transistor, and a dummy gate electrode between the first and the second pull-up transistors. The second SRAM cell includes a third pull-up transistor and a fourth pull-up transistor. No dummy gate electrode is disposed between the third and the fourth pull-up transistors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first pull-up transistor;
   a second pull-up transistor; and
   a dummy gate electrode between the first and the second pull-up transistors, wherein the first and the second pull-up transistors are comprised in a first Static Random Access Memory (SRAM) cell.

2. The device of claim 1, wherein the dummy gate electrode is between, and is aligned to, a first drain of the first pull-up transistor and a second drain of the second pull-up transistor.

3. The device of claim 1, wherein the dummy gate electrode is formed of a same material as a gate electrode of the first pull-up transistor.

4. The device of claim 1 further comprising:
   a semiconductor substrate; and
   an isolation region extending from a top surface of the semiconductor substrate into the semiconductor substrate, wherein the dummy gate electrode overlaps the isolation region.

5. The device of claim 1 further comprising:
   a first pull-down transistor, wherein the dummy gate electrode and the first pull-down transistor are on opposite sides of the first pull-up transistor; and
   a second pull-down transistor, wherein the dummy gate electrode and the second pull-down transistor are on opposite sides of the second pull-up transistor, and wherein the first and the second pull-up transistors and the first and the second pull-down transistors form a latch.

6. The device of claim 1, wherein the dummy gate electrode is between a first gate electrode of the first pull-up transistor and a second gate electrode of the second pull-up transistor, and is between a drain of the first pull-up transistor and a drain of the second pull-up transistor.

7. The device of claim 1 further comprising a second SRAM cell larger than the first SRAM cell, wherein the first and the second SRAM cells are in a same chip, and wherein the second SRAM cell is free from dummy gate electrodes therein.

8. A device comprising:
   a first pull-up transistor comprising:
      a first active region;
      a first gate electrode over the first active region; and
      a first drain region on a side of the first gate electrode;
   a second pull-up transistor comprising:
      a second active region;
      a second gate electrode over the second active region; and
      a second drain region on a side of the second gate electrode; and
   a dummy gate electrode between the first and the gate electrodes, and between the first and the second drain regions, wherein the first pull-up transistor, the second pull-up transistor, and the dummy gate electrode are comprised in a Static Random Access Memory (SRAM) cell.

9. The device of claim 8 further comprising a Shallow Trench Isolation (STI) region between and contacting the first and the second active regions, wherein the dummy gate electrode overlaps a portion of the STI region.

10. The device of claim 8 further comprising a dummy gate dielectric overlapped by the dummy gate electrode.

11. The device of claim 8, wherein the dummy gate electrode is electrically floating.

12. The device of claim 8 further comprising dummy gate spacers on opposite sidewalls of the dummy gate electrode, wherein the first and the second drain regions contact sidewalls of the dummy gate spacers.

13. The device of claim 8 further comprising a second SRAM cell larger than the first SRAM cell, wherein the second SRAM cell is free from dummy gate electrodes.

14. The device of claim 8 further comprising:
   a first pull-down transistor, wherein the dummy gate electrode and the first pull-down transistor are on opposite sides of the first pull-up transistor; and
   a second pull-down transistor, wherein the dummy gate electrode and the second pull-down transistor are on opposite sides of the second pull-up transistor, and wherein the first and the second pull-up transistors and the first and the second pull-down transistors form a latch.

15. A device comprising:
   a first Static Random Access Memory (SRAM) cell comprising:
      a first pull-up transistor;
      a second pull-up transistor; and
      a dummy gate electrode between the first and the second pull-up transistors; and
   a second SRAM cell in a same chip as the first SRAM cell, wherein the second SRAM cell comprises:
      a third pull-up transistor; and
      a fourth pull-up transistor, wherein no dummy gate electrode is disposed between the third and the fourth pull-up transistors.

16. The device of claim 15, wherein the first SRAM cell occupies a chip area smaller than a chip area of the second SRAM cell.

17. The device of claim 15, wherein a first drain of the first pull-up transistor and a second drain of the second pull-up transistor have a first distance, and wherein a third drain of the third pull-up transistor and a fourth drain of the fourth pull-up transistor have a second distance greater than the first distance.

18. The device of claim 15, wherein the dummy gate electrode is electrically floating.

19. The device of claim 15, wherein the dummy gate electrode is located between, and is aligned to, a first drain of the first pull-up transistor and a second drain of the second pull-up transistor.

20. The device of claim 15 further comprising:
   a first pull-down transistor in the first SRAM cell, wherein the dummy gate electrode and the first pull-down transistor are on opposite sides of the first pull-up transistor; and
   a second pull-down transistor in the first SRAM cell, wherein the dummy gate electrode and the first pull-down transistor are on opposite sides of the first pull-up transistor, and wherein the first and the second pull-up transistors and the first and the second pull-down transistors form a latch.

* * * * *